United States Patent
Pan

(10) Patent No.: US 6,353,247 B1
(45) Date of Patent: Mar. 5, 2002

(54) HIGH VOLTAGE ELECTROSTATIC DISCHARGE PROTECTION CIRCUIT

(75) Inventor: Jui-Hsiang Pan, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/557,513

(22) Filed: Apr. 25, 2000

(30) Foreign Application Priority Data

Apr. 15, 2000 (TW) .............................. 89107075 A

(51) Int. Cl.$^7$ .............................................. H01L 29/72
(52) U.S. Cl. ................. 257/355; 257/173; 257/174; 257/487; 257/356; 257/357; 257/360; 257/546; 257/378

(58) Field of Search .................................. 257/355, 173, 257/174, 487, 356, 357, 360, 546, 378

(56) References Cited

U.S. PATENT DOCUMENTS 6,274,908 B1 * 8/2001 Yamaguchi et al. ........ 257/355

* cited by examiner

Primary Examiner—Edward Wojciechowicz
(74) Attorney, Agent, or Firm—J.C. Patents

(57) ABSTRACT

A high voltage electrostatic discharge protection circuit having a virtual $N^+$ region additionally formed according to the invention is disclosed. Due to the formation of the virtual $N^+$ region, the distance between the base and collector of a parasitic bipolar junction transistor is greatly increased to keep its holding voltage always greater than its operation voltage, thereby preventing a problem of latch up.

3 Claims, 3 Drawing Sheets

HIGH VOLTAGE ELECTROSTATIC DISCHARGE PROTECTION CIRCUIT

CROSS-REFERENCE TO RELATED APPLICATION

This application claims the priority benefit of Taiwan application serial no. 89107075, filed Apr. 15, 2000.

BACKGROUND OF THE INVENTION

1. Field of the Invention

The invention relates to a high voltage electrostatic discharge protection circuit, and more particularly to a high voltage electrostatic discharge protection circuit having a virtual $N^{30}$ region for increasing the distance between the base and collector of a parasitic bipolar junction transistor to ensure that its holding voltage is greater than its operation voltage, thereby preventing a problem of latch up.

2. Description of the Prior Art

In semiconductor industry, electrostatic discharge (ESD) is always a main reason to cause damages on ICs during manufacturing. For example, under an environment with higher relative humidity (RH), there will be several hundred, even several thousand, voltages of electrostatic charges detected when a person walks through a rug. In an environment with lower relative humidity, electrostatic charges will reach more than ten thousand voltages. When the rug or person bringing high voltage electrostatic charges contacts a chip, the electrostatic charges will be discharged toward the chip, causing irretrievable damages on the chip. To prevent chips from any damages caused by electrostatic charge discharge, various electrostatic discharge protection circuits have been developed. Typically, in the prior art, an on-chip electrostatic discharge protection circuit is designed between an internal circuit and each pad for protecting the internal circuit from damages.

Referring to FIG. 1, a structure of a conventional high voltage electrostatic discharge protection circuit is shown. In the conventional high voltage electrostatic discharge protection circuit, a high voltage N-well region 12 and a high voltage P-well region 14 adjacent to each other are formed in an N-type substrate 10. A PMOS transistor 16 is formed on the high voltage N-well region 12. The PMOS transistor 16 has its gate 18 and source 20 electrically connected to a high voltage $V_{DD}$, together and its drain electrically connected to an input/output pad (I/P PAD) 23.

The source 20 is constructed by a $P^+$-type region 24, a P-grad region 26 and a P-drift region 28. The P-grade region 26 is beneath and sounding the $P^+$-type region 24. The P-drift region 28 is adjacent to the P-grade region 26, partly under the gate 18. Similarly, the drain 22 is constructed by a $P^+$-type region 30, a P-grade region 32 and a P-drift region 34. The P-grade region 32 is beneath and surrounding the $P^+$-type region 30. The P-grade region 32 is beneath and surrounding the $P^+$-type region 30. The P-drift region 34 is adjacent to the P-grade region 32, partly under the gate 18. Furthermore, on the high voltage N-type well region 12, there are an $N^+$-base connection region 38 electrically connected to the high voltage $V_{DD}$ and a first isolation region 36, wherein the source 20 and the N-base connection region 38 are adjacent to both sides of the first isolation region 36.

Similarly, an NMOS transistor 42 is formed on the high voltage P-well region 14. The NMOS transistor 42 has its gate 44 and source 46 electrically connected to ground $V_{ss}$, together and its drain 48 electrically connected to the input/output pad 23. The drain 48 is constructed by an $N^+$-type region 50, an N-grade region 52 and an N-drift region 54. The N-grade region 52 is beneath and surrounding the $N^+$-type region 50. The N-type drift region 54 is adjacent to the N-grade region 52, partly under the gate 42. The source 46 is constructed by an $N^+$-type region 56, an N-grade region 58 and an N-drift region 60. The N-grade region 58 is beneath and surrounding the $N^+$-type region 56. The drift region 60 is adjacent to the N-grade region 58, partly under the gate 44. Moreover, on the high voltage P-well region 14, there are an $P^+$-base connection region 64 electrically connected to the ground $V_{ss}$, wherein the source 46 and the $P^+$-base connection region 64 are adjacent to both sides of a second isolation region 62.

Additionally, there is a third isolation region 40 is formed on the N-type substrate 10 and between the high voltage N-well region 12 and the high voltage P-well region 14. In other words, the drain 22 of the PMOS transistor 16 and the drain 48 of the NMOS transistor 42 are located on both sides of the third isolation region 40.

Due to the requirement of high voltage process, the P-well region 14 is formed with high resistance. Consequently, two parasitic bipolar junction transistors 66, 68 shown in FIG. 1 have a higher breakdown voltage (BV). Meanwhile, as shown in FIG. 2, after the input voltage of each parasitic bipolar junction transistors 66, 68 reaches the trigging voltage Vtl (i.e., the two parasitic bipolar junction transistors 66, 68 are turned on), the input voltages speedily drops to a snapback voltage Sb, the current flowing through the two bipolar junction transistors 66, 68 is greatly increased and then the input voltage is over an operation high voltage Vop. Since the P-well region 14 has higher resistance, the snapback voltage Sb is much lower than the operation high voltage Vop. Therefore, during a normal operation, a latch up problem will be caused to malfunction IC products once the electrostatic discharge protection circuit is electrically conducted.

SUMMARY OF THE INVENTION

In view of the above, the invention is to provide a high voltage electrostatic discharge protection circuit having a virtual $N^+$region for adjusting the gain β of a parasitic bipolar junction transistor to ensure that its holding voltage is always greater than its operation voltage, by increasing the distance between the base and collector of the parasitic bipolar junction transistor, thereby preventing a problem of latch up.

The structure of the high voltage electrostatic discharge protection circuit is as follows. A high voltage N-well region is formed on the substrate. A high voltage P-well region is formed on the substrate and adjacent to the high voltage N-well region. A PMOS transistor is formed on the high voltage N-well region, having its gate and source electrically connected to a high voltage source, together and its drain electrically connected to an input/output terminal, wherein each of the drain and source is constructed by a $P^+$-type region, a P-grade region located under and surrounding the $P^+$type region and a P-drift region adjacent to the P-grade region, partly under the gate of the PMOS transistor. An $N^+$-base connection region is formed on the high voltage N-well region and electrically connected to the high voltage source. A first isolation region is formed on the high voltage N-well region, having the source of the PMOS transistor and the $N^+$-base connection region adjacent to both sides thereof. An NMOS transistor is formed on the high voltage P-well region, having its gate and source electrically connected to ground, together and its drain located on the junction of the high voltage P-well region and the high voltage N-well region, wherein each of the drain and the source is constructed by an N$^+$-type region, an N-grade region located under and surrounding the N$^+$-type region and an N-drift region adjacent to the N-grade region, partly under the gate of the NMOS transistor. A P$^+$-base connection region is formed on the high voltage P-well region and electrically connected to the ground. A second isolation region is formed on the high voltage P-well region, having the source of the NMOS transistor and the P$^+$-base connection region adjacent to both sides thereof. A virtual N$^+$region is formed on the high voltage N-well region and electrically connected to the input/output terminal. A third isolation region is formed on the high voltage N-well region and having the drain of the PMOS transistor and the virtual N$^+$region adjacent to both sides thereof. A fourth isolation region is formed on the high voltage N-well region and having the drain of the NMOS transistor and the virtual N$^+$region adjacent to both sides thereof.

According to the invention, since the additional virtual N$^+$region and the fourth isolation region are additionally formed on the high voltage N-well region, the distance between the base and collector of a parasitic bipolar junction transistor is increased a predetermined value. Therefore, the gain of the parasitic bipolar junction transistor can be greatly reduced thereby to keep its holding voltage always greater than its operation voltage. As a result, the problem of latch up can be efficiently prevented.

BRIEF DESCRIPTION OF THE DRAWINGS

The invention will become more fully understood from the detailed description given hereinafter and the accompanying drawings which are given by way of illustration only, and thus do not limit the present invention, and wherein.

DETAILED DESCRIPTION OF THE PREFERRED EMBODIMENTS

Figure 1:
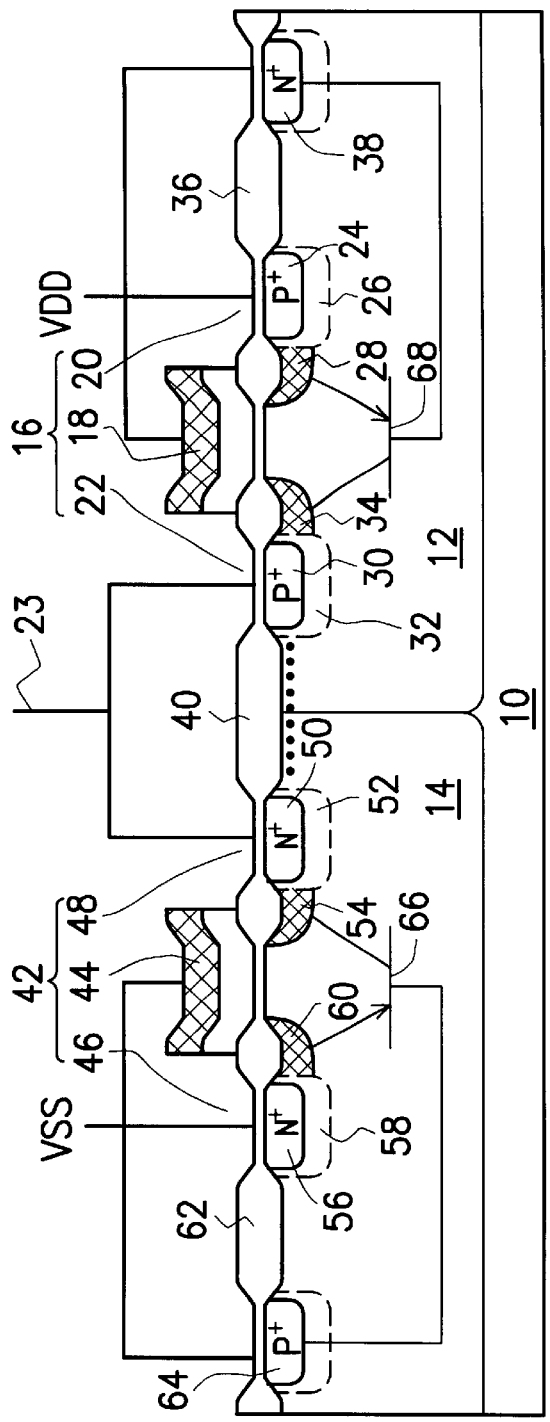
FIG. 1 is a schematic, cross-sectional view showing a structure of a high voltage electrostatic discharge protection circuit according to the prior art.
Figure 2:
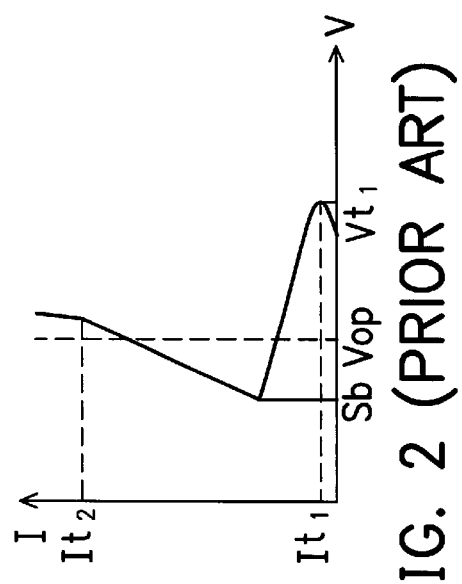
FIG. 2 is a characteristic curve of parasitic bipolar junction transistors of the prior high voltage electrostatic discharge protection circuit.
Figure 3:
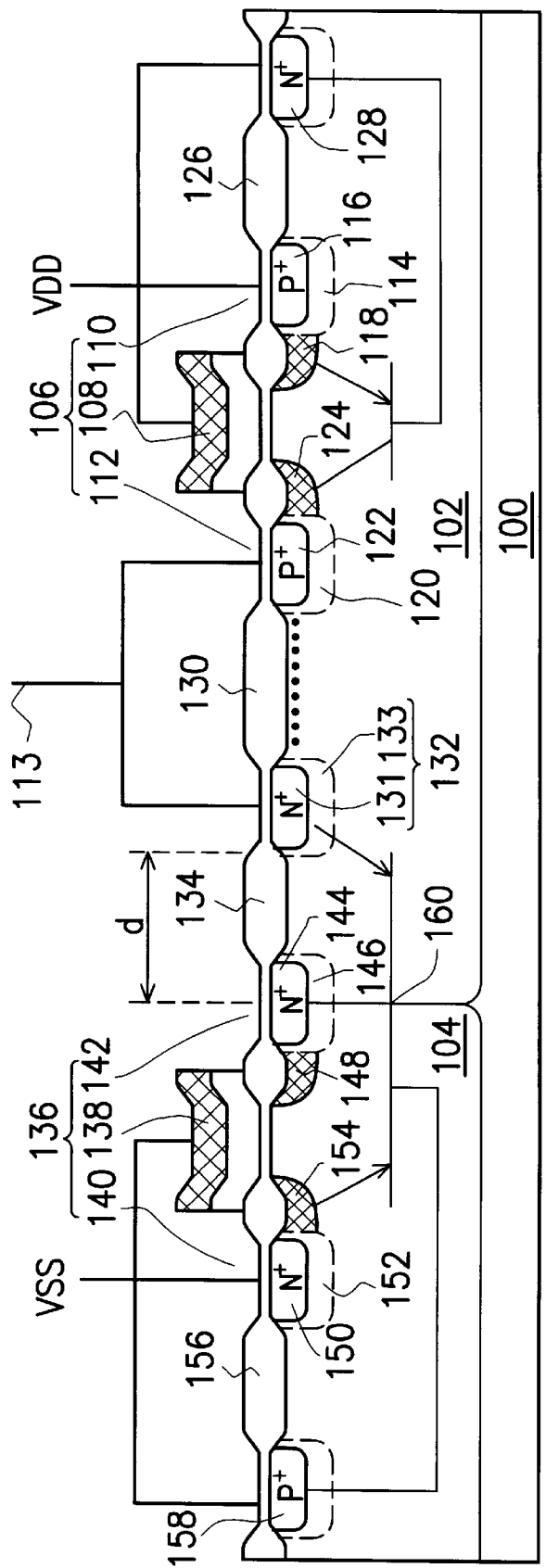
FIG. 3 is a schematic, cross-sectional view showing a structure of a high voltage electrostatic discharge protection circuit according to a preferred embodiment of the invention.

Referring to FIG. 3, a high voltage electrostatic discharge protection circuit according to a preferred embodiment of the invention is shown. In FIG. 3, a high voltage N-well region 102 and a high voltage P-well region 104 adjacent to each other are formed in an N-type substrate 100. A PMOS transistor 106 is formed on the high voltage N-well region 102 and has its gate 108 and source 110 electrically connected to a high voltage source $V_{DD}$, and its drain 112 electrically connected to an input/output pad (I/P PAD) 113.

The source 110 is constructed by a P$^+$-type region 116, a P-grade region 114 and a P-drift region 118. The P-grade region 114 is beneath and surrounding the P$^+$-type region 116. The P-drift region 118 is adjacent to the P-grade region 114, partly under the gate 108. Similarly, the drain 112 is constructed by a P$^+$-type region 122, a P-grade region 120 and a P-drift region 124. The P-grade region 120 is beneath and surrounding the P$^+$-type region 122. The P-drift region 124 is adjacent to the P-grade region 120, partly under the gate 108.

On the high voltage N-type well region 102, there are formed an N$^+$-base connection region 128 electrically connected to the high voltage source $V_{DD}$ and a first isolation region 126, wherein the source 110 and the N$^+$-base connection region 128 are adjacent to both sides of the first isolation region 126. Furthermore, there is a virtual N$^+$region 132 formed on the high voltage N-well region 102. The virtual N$^+$region 132 electrically connected to the input/output pad (I/P PAD) 113 is constructed by an N$^+$-type region 131 and an N-grade region 133. The virtual N$^+$region 132 and the drain 112 of the PMOS transistor 106 are adjacent to both sides of a third isolation region 130.

Similarly, an NMOS transistor 136 is formed on the high voltage P-well region 104. The NMOS transistor 136 has its gate 138 and source 140 electrically connected to ground $V_{ss}$, together and its drain 142 located on the junction of the high voltage N-well region 102 and the high voltage P-well region 104. The drain 140 is constructed by an N$^+$-type region 150, an N-grade region 152 and an N-drift region 154. The N-grade region 152 is beneath and surrounding the N$^+$-type region 150. The N-drift region 154 is adjacent to the N-grade region 152, partly under the gate 138.

The source 142 is constructed by an N$^+$-type region 144, an N-grade region 146 and an N-drift region 148. The N-grade region 146 is beneath and surrounding the N$^+$type region 144. The N-drift region 148 is adjacent to the N-grade region 146, partly under the gate 138. Furthermore, on the high voltage P-type well region 104, there are formed an P$^+$-base connection region 158 electrically connected to the ground $V_{ss}$ and a second isolation region 156, wherein the source 140 and the P$^+$-base connection region 158 are adjacent to both sides of the second isolation region 156. The virtual N$^+$region 132 and the drain 142 of the NMOS transistor 136 are adjacent to both sides of a fourth isolation region 134.

Figure 4:
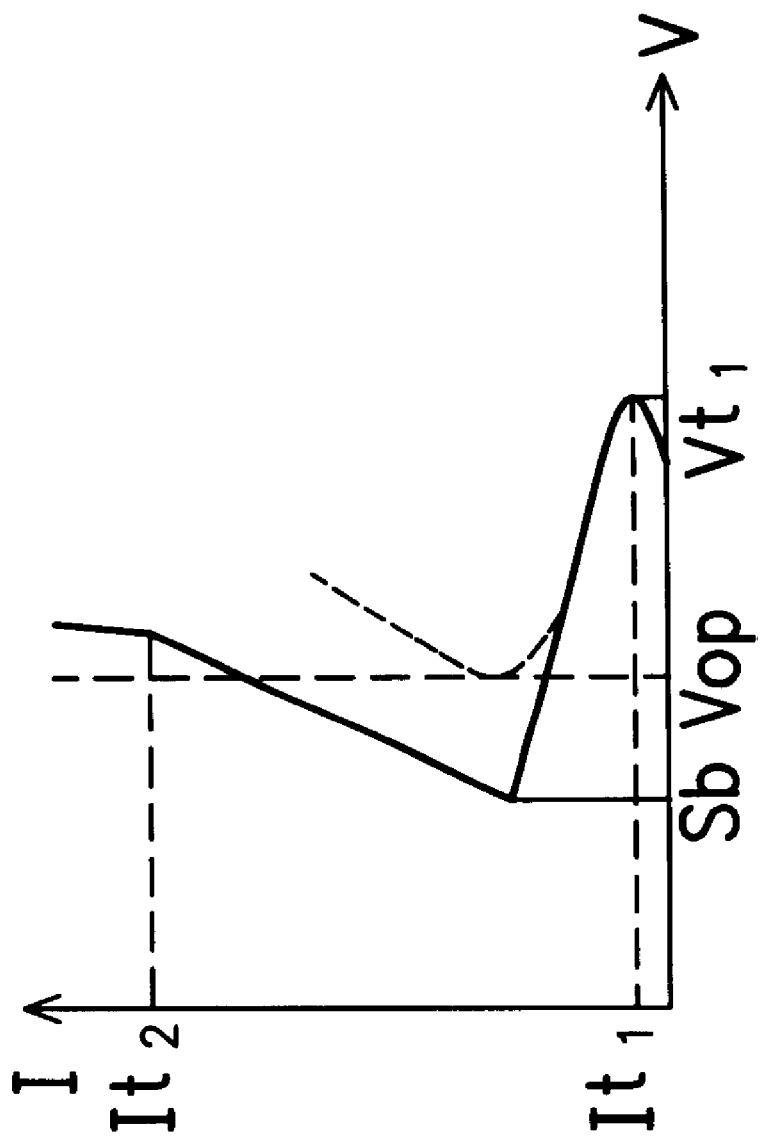
FIG. 4 is a characteristic curve of parasitic bipolar junction transistors of the inventive high voltage electrostatic discharge protection circuit.

As described above, since the additional virtual N$^+$region 132 and the fourth isolation region 134 are additionally formed on the high voltage N-well region 102, the distance d between the base and collector of a parasitic bipolar junction transistor 160 shown in FIG. 3 is increased a predetermined value. Therefore, the gain of the parasitic bipolar junction transistor 160 can be greatly reduced to keep its holding voltage always greater than its operation voltage as shown the dashed-line of FIG. 4. As a result, the problem of latch up can be efficiently prevented.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A high voltage electrostatic discharge protection circuit comprising:

a substrate;

a high voltage N-well region formed on the substrate;

a high voltage P-well region formed on the substrate and adjacent to the high voltage N-well region;

a PMOS transistor formed on the high voltage N-well region, having its gate and source electrically connected to a high voltage source, together and its drain electrically connected to an input/output terminal, wherein each of the drain and source is constructed by a $P^+$-type region, a P-grade region located under and surrounding the $P^+$-type region and a P-drift region adjacent to the P-grade region, partly under the gate of the PMOS transistor;

an $N^+$-base connection region formed on the high voltage N-well region and electrically connected to the high voltage source;

a first isolation region formed on the high voltage N-well region, having the source of the PMOS transistor and the $N^+$-base connection region adjacent to both sides thereof;

an NMOS transistor formed on the high voltage P-well region, having its gate and source electrically connected to ground, together and its drain located on the junction of the high voltage P-well region and the high voltage N-well region, wherein each of the drain and the source is constructed by an $N^+$-type region, an N-grade region located under and surrounding the $N^+$-type region and an N-drift region adjacent to the N-grade region, partly under the gate of the NMOS transistor;

a $P^+$-base connection region formed on the high voltage P-well region and electrically connected to the ground;

a second isolation region formed on the high voltage P-well region, having the source of the NMOS transistor and the $P^+$-base connection region adjacent to both sides thereof;

a virtual $N^+$ region formed on the high voltage N-well region and electrically connected to the input/output terminal;

a third isolation region formed on the high voltage N-well region and having the drain of the PMOS transistor and the virtual $N^+$ region adjacent to both sides thereof; and a fourth isolation region formed on the high voltage N-well region and having the drain of the NMOS transistor and the virtual $N^+$ region adjacent to both sides thereof.

2. The high voltage electrostatic discharge protection circuit as defined in claim 1, wherein the substrate is an N-type substrate.

3. The high voltage electrostatic discharge protection as defined in claim 1, wherein the virtual $N^+$ region is constructed by an $N^+$-type region and an N-grad region.

* * * * *